(12) United States Patent
Uehara

(10) Patent No.: US 10,074,523 B2
(45) Date of Patent: *Sep. 11, 2018

(54) POLYCRYSTALLINE CAF2 MEMBER, MEMBER FOR PLASMA TREATMENT DEVICE, PLASMA TREATMENT DEVICE, AND METHOD FOR PRODUCING FOCUSING RING

(71) Applicant: NIKON CORPORATION, Tokyo (JP)

(72) Inventor: Naoyasu Uehara, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 745 days.

This patent is subject to a terminal disclaimer.

(21) Appl. No.: 14/589,404

(22) Filed: Jan. 5, 2015

(65) Prior Publication Data
US 2015/0107768 A1    Apr. 23, 2015

Related U.S. Application Data

(63) Continuation of application No. PCT/JP2013/068395, filed on Jul. 4, 2013.

(30) Foreign Application Priority Data

Jul. 5, 2012 (JP) .................................. 2012-151367

(51) Int. Cl.
*C04B 37/00* (2006.01)
*C30B 29/12* (2006.01)
(Continued)

(52) U.S. Cl.
CPC ........ *H01J 37/32642* (2013.01); *C01F 11/22* (2013.01); *C04B 35/553* (2013.01); *C04B 37/001* (2013.01); *C04B 2235/3208* (2013.01); *C04B 2235/445* (2013.01); *C04B 2235/5436* (2013.01); *C04B 2235/5445* (2013.01);
(Continued)

(58) Field of Classification Search
None
See application file for complete search history.

(56) References Cited

U.S. PATENT DOCUMENTS

2001/0046112 A1* 11/2001 Herchen ............. H01L 21/6831
361/234
2004/0094871 A1*  5/2004 Ito ............................. B32B 18/00
264/434
(Continued)

FOREIGN PATENT DOCUMENTS

CN     1684236    10/2005
JP     6-298574   10/1994
(Continued)

OTHER PUBLICATIONS

PCT International Preliminary Report on Patentability and Written Opinion of the International Searching Authority dated Jan. 15, 2015 in corresponding International Patent Application No. PCT/JP2013/068395.
(Continued)

*Primary Examiner* — Rakesh K Dhingra
*Assistant Examiner* — Laureen Chan

(57) ABSTRACT

A polycrystalline $CaF_2$ member includes a combined assembly of a plurality of polycrystalline bodies made from $CaF_2$ that are pressure bonded together.

8 Claims, 3 Drawing Sheets

(51) Int. Cl.
  *H01J 37/32* (2006.01)
  *C01F 11/22* (2006.01)
  *C04B 35/553* (2006.01)
  *C23C 16/458* (2006.01)
(52) U.S. Cl.
  CPC .. *C04B 2235/6581* (2013.01); *C04B 2235/77* (2013.01); *C04B 2235/786* (2013.01); *C04B 2235/94* (2013.01); *C04B 2235/963* (2013.01); *C04B 2235/9669* (2013.01); *C04B 2237/36* (2013.01); *C04B 2237/76* (2013.01); *C04B 2237/78* (2013.01); *C23C 16/4585* (2013.01); *Y10T 428/256* (2015.01)

(56) References Cited

U.S. PATENT DOCUMENTS

| | | | |
|---|---|---|---|
| 2005/0268694 A1* | 12/2005 | Moriya | B08B 9/08 73/28.01 |
| 2007/0137792 A1 | 6/2007 | Moriya et al. | |
| 2007/0144670 A1 | 6/2007 | Moriya et al. | |
| 2009/0053835 A1 | 2/2009 | Moriya et al. | |
| 2009/0294064 A1 | 12/2009 | Nagayama | |
| 2011/0094680 A1 | 4/2011 | Moriya et al. | |

FOREIGN PATENT DOCUMENTS

| | | |
|---|---|---|
| JP | 2000-72554 | 3/2000 |
| JP | 2000-86344 | 3/2000 |
| JP | 2000072554 A * | 3/2000 |
| JP | 2000086344 A * | 3/2000 |
| JP | 2005-317900 | 11/2005 |
| JP | 2009-290087 | 12/2009 |
| JP | 2011-3730 | 1/2011 |
| WO | WO 2012/165334 A1 | 12/2012 |

OTHER PUBLICATIONS

Chinese Office Action dated Apr. 15, 2016 in corresponding Chinese Patent Application No. 201380035575.0.
InternationalSearch Report dated Sep. 24, 2013 in corresponding international application PCT/JP2013/068395.
Chinese Office Action dated Aug. 25, 2015 in corresponding Chinese Patent Application No. 201380035575.0.
Taiwanese Office Action dated Jul. 19, 2016 in corresponding Taiwanese Patent Application No. 102124104.
Japanese Office Action dated Nov. 8, 2016 in corresponding Japanese Patent Application No. 2014-523791.
Taiwanese Office Action dated Nov. 30, 2016 in corresponding Taiwanese Patent Application No. 102124104.

* cited by examiner

FIG.3

| | SURFACE ROUGHNESS Ra (μm) | HOLDING TEMPERATURE (°C) | PRESSURIZING FORCE MPa | PRESSURE BONDING RESULT |
|---|---|---|---|---|
| EMBODIMENT #1 | 0.16 | 1200 | 1.8 | ○ |
| EMBODIMENT #2 | 0.50 | 1200 | 1.8 | ○ |
| EMBODIMENT #3 | 1.00 | 1200 | 1.8 | ○ |
| EMBODIMENT #4 | 0.16 | 1200 | 0.9 | ○ |
| EMBODIMENT #5 | 0.50 | 1200 | 0.9 | ○ |
| EMBODIMENT #6 | 1.00 | 1200 | 0.9 | ○ |
| EMBODIMENT #7 | 0.19 | 1000 | 0.9 | ○ |
| EMBODIMENT #8 | 0.37 | 1000 | 0.9 | ○ |
| COMPARISON EXAMPLE #1 | 1.67 | 1000 | 0.9 | × |
| COMPARISON EXAMPLE #2 | 0.17 | 800 | 0.9 | × |
| COMPARISON EXAMPLE #3 | 0.57 | 800 | 0.9 | × |
| COMPARISON EXAMPLE #4 | 1.04 | 800 | 0.9 | × | ously

POLYCRYSTALLINE CAF2 MEMBER, MEMBER FOR PLASMA TREATMENT DEVICE, PLASMA TREATMENT DEVICE, AND METHOD FOR PRODUCING FOCUSING RING

INCORPORATION BY REFERENCE

This application is a continuation of International Application No. PCT/JP2013/068395 filed Jul. 4, 2013. The disclosures of the following priority applications are herein incorporated by references:

Japanese Patent Application No. 2012-151367 filed Jul. 5, 2012.

International Application No. PCT/JP2013/068395 filed Jul. 4, 2013.

BACKGROUND OF THE INVENTION

1. Field of the Invention

The present invention relates to a polycrystalline $CaF_2$ member, to a member for a plasma treatment device, to a plasma treatment device, and to a method for producing a focusing ring.

2. Description of Related Art

As a plasma resistant member for a semiconductor manufacturing device, a focusing ring comprising a plurality of members has been known from Japanese Laid-Open Patent Publication 2009 290087 and Japanese Laid-Open Patent Publication 2011 3730.

SUMMARY OF INVENTION

However, there is the problem that an adhesive or a band member that is used when joining together the plurality of members may constitute a source of contamination.

According to the 1st aspect of the present invention, a polycrystalline $CaF_2$ member comprises a combined assembly of a plurality of polycrystalline bodies made from $CaF_2$ that are pressure bonded together.

According to the 2nd aspect of the present invention, it is preferred that in the polycrystalline $CaF_2$ member according to the 1st aspect, a mean particle diameter of crystalline particles of the polycrystalline bodies is greater than or equal to 200 μm.

According to the 3rd aspect of the present invention, it is preferred that in the polycrystalline $CaF_2$ member according to the 1st or 2nd aspect, a relative density of polycrystalline $CaF_2$ of the polycrystalline bodies is greater than or equal to 94.0%.

According to the 4th aspect of the present invention, a member for a plasma treatment device comprises the polycrystalline $CaF_2$ member according to any one of the 1st through 3rd aspects.

According to the 5th aspect of the present invention, the member for a plasma treatment device according to the 4th aspect is a focusing ring.

According to the 6th aspect of the present invention, a plasma treatment device comprises the member for a plasma treatment device according to the 4th or 5th aspect.

According to the 7th aspect of the present invention, a method for producing a focusing ring comprises, preparing a plurality of partial members made from polycrystalline $CaF_2$; and pressure bonding together the plurality of partial members to form a single polycrystalline $CaF_2$ member.

According to the 8th aspect of the present invention, it is preferred that in the method for producing a focusing ring according to the 7th aspect, a holding temperature when pressure bonding together the plurality of partial members is between 1000° C. and 1200° C. inclusive.

According to the 9th aspect of the present invention, it is preferred that in the method for producing a focusing ring according to the 8th aspect, a pressurization force when pressure bonding together the plurality of partial members is between 0.9 MPa and 1.8 MPa inclusive.

According to the 10th aspect of the present invention, it is preferred that in the method for producing a focusing ring according to the 19th aspect, each of the plurality of partial members has a junction surface that is joined to another partial member during the pressure bonding, and a surface roughnesses of the junction surfaces are 1.0 μm or less.

BRIEF DESCRIPTION OF DRAWINGS

FIG. 3 is a figure showing the results of pressure bonding of a test specimen, for various different values of surface roughness, holding temperature, and pressurizing force.

DESCRIPTION OF EMBODIMENTS

A focusing ring which is one example of a polycrystalline CaF2 (calcium fluoride) member according to an embodiment of the present invention will now be explained with reference to the drawings. The focusing ring of this embodiment is a member that is used in a plasma treatment device, and is manufactured by joining together a plurality of partial members (i.e. bodies) that are made from polycrystalline CaF2 by pressure bonding. It should be understood that this embodiment is explained in concrete terms in order to make the gist of the present invention better understood, and is not to be considered as being limitative of the present invention, unless particularly so specified.

Figure 1A:
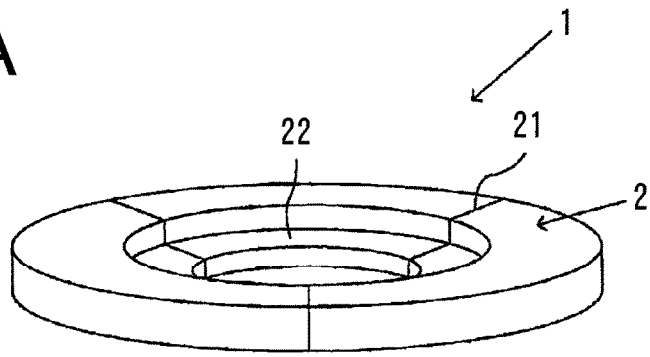
FIGS. 1A-1D are various external views of a focusing ring according to an embodiment of the present invention.
Figure 1B:
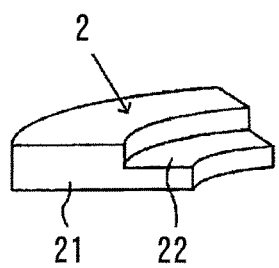

The structure of the focusing ring 1 according to this embodiment is shown in FIGS. 1A-1D. As shown in FIG. 1A, the focusing ring 1 is a combined assembly that is produced by three partial members 2 being joined together, and is formed as an annulus. Each one of the partial members 2 that make up the focusing ring 1 has the shape shown in FIG. 1B. This partial member 2 has a junction surface 21 that joins to the other partial members 2 and a step portion 22, and the focusing ring 1 is formed by three of the partial members 2 being joined together at their junction surfaces 21. The focusing ring 1 is a member that is provided around the periphery of an object that is to be processed by being plasma etched with a plasma treatment device, and is provided in order to reduce non-uniformity of the etching speed of the object to be processed that might originate from a non-uniform plasma distribution. Moreover, since it is possible to support the object to be processed with the step portion 22, accordingly this focusing ring 1 is also used as a support jig when shifting or when handling the object to be processed. When the object to be processed is exposed to plasma in a dry etching process, the focusing ring 1 is also exposed to the plasma in a similar manner, and is etched. Due to this, a high etching resistance is demanded for the focusing ring 1.

The number of partial members 2 that make up the focusing ring 1 is not to be considered as being limited to three as described above; it would be possible to make the focusing ring 1 with the optimum number of partial members 2 according to its size and so on. It should be understood that the method of manufacturing the focusing ring 1 will be described in detail hereinafter.

As described above, the partial members 2 are manufactured from polycrystalline $CaF_2$, that has excellent workability and corrosion resistance. In order for the partial members 2 to have excellent workability, the relative density of the polycrystalline $CaF_2$ from which the partial members 2 are formed is set to 94.0% or higher. More desirably, the relative density of the polycrystalline $CaF_2$ may be set to 99.0% or higher. Furthermore, in order for the partial members 2 to have corrosion resistance, it is desirable for the mean particle diameter of the crystalline particles of the polycrystalline $CaF_2$ from which the partial members 2 are formed to be 200 μm or higher.

It should be understood that the relative density of the polycrystalline $CaF_2$ of the present application may be expressed as a percentage by measuring the density of the polycrystalline $CaF_2$ using Archimedes's law, and by obtaining the ratio of the density of that polycrystalline $CaF_2$ with respect to the density of a single crystal of $CaF_2$. Furthermore, in accordance with JISR1670 "Testing method for grain size in microstructure of fine ceramics", the mean particle diameter of the polycrystalline $CaF_2$ is obtained by observing any appropriate three fields of view of a single test specimen with a scanning type electron microscope (SEM), and by measuring the long axes and the short axes of the crystalline particles within each of these fields of view and taking their averages.

In the following, the properties possessed by $CaF_2$, single crystal $CaF_2$, and polycrystalline $CaF_2$ will be explained. As compared with $MgF_2$ and $BaF_2$ that are also fluorides, $CaF_2$ is a stable fluoride whose deliquescency is low. Moreover, $CaF_2$ is effective as a material for a plasma resistant member or for a crucible member, since its fluorine plasma resistance, its HF (hydrogen fluoride) resistance, its chemical resistance, and its heat resistance are excellent. And single crystal $CaF_2$ is sometimes used as a lens material, since it has a high transmittivity characteristic, from the far ultraviolet region through to the infra-red region. However, single crystal $CaF_2$ has the property that it can easily be broken by vibration or shock, since it is easily cleaved. By contrast, polycrystalline $CaF_2$ is harder to break than single crystal $CaF_2$, due to the fact that, in bulk, it is not so easily cleaved, because it is made by combining together minute crystals.

Next, the relationship between the mean particle diameter of the crystalline particles of polycrystalline $CaF_2$ and their corrosion resistance will be explained. In connection with the corrosion resistance of the crystalline particles of polycrystalline $CaF_2$, in particular their resistance to etching (etching resistance) will be explained. The mean particle diameter of the crystalline particles of polycrystalline $CaF_2$ that are used for manufacturing the partial members 2 of this embodiment is greater than or equal to 200 μm. According to research by the present inventor, it has become clear that, with polycrystalline $CaF_2$, the corrosion resistance becomes higher as the crystal particle diameter increases, and that, when the crystal particle diameter becomes greater than or equal to 200 μm, the corrosion resistance becomes saturated. Since etching is a phenomenon that progresses from the crystal interfaces, accordingly, when the number of crystal interfaces decreases due to increase of the crystal particle diameter, the amount of interfaces at which etching can easily take place decreases. Due to this, along with increase of the crystal particle diameter of the polycrystalline $CaF_2$, the corrosion resistance becomes higher. Due to the fact that the polycrystalline $CaF_2$ that is used in this embodiment has a mean particle diameter of 200 μm or greater, it is considered that its corrosion resistance approaches the corrosion resistance that is possessed by a single crystal of $CaF_2$. Accordingly, in addition to the advantage with which the polycrystalline body used in this embodiment is endowed that it is not easily cleaved, it also simultaneously has the advantageous aspect of possessing excellent corrosion resistance, equivalent to that of a single crystal.

The method for manufacturing a partial member 2 made from polycrystalline $CaF_2$ having the characteristics described above will now be explained. First, polycrystalline $CaF_2$ whose relative density is 94.0% or greater and the mean particle diameter of whose crystalline particles is 200 μm or greater is obtained in the following manner.

The particle diameter of the raw powder $CaF_2$ material (i.e. its median diameter) is desirably less than or equal to 3 μm, and more desirably is less than or equal to 0.5 μm. If the particle diameter of the raw powder $CaF_2$ material is large, then it is desirable for it to be used after having been pulverized in advance with a ball mill or the like.

Using the $CaF_2$ raw powder material described above, forming is performed by using, for example, the CIP method (cold isotropic pressing method), or by using a casting method. The CIP method is a method of temporarily forming the $CaF_2$ raw powder material using a die press, and, after the temporarily compacted mass has been vacuum packed, setting it into a CIP device and maintaining the pressure at, for example, 100 MPa for one hour, thus forming a compacted mass. And the casting method is a method in which a slurry made by mixing the $CaF_2$ raw powder material with water is put into a gypsum mold, and, after having obtained a compacted mass by leaving the mixture to stand, for example, at room temperature for at least 48 hours, by taking this compacted mass out of the gypsum mold and then drying it for 48 hours at 80° C. in a drying oven.

The compacted mass that has been obtained as described above is put into a vacuum sintering oven, and is sintered in a vacuum environment. With the objective of increasing the compactness of the $CaF_2$ and of preventing oxidization thereof, it is desirable for the vacuum level during the sintering process to be 10 Pa or less. In the sintering process, the compacted mass is sintered for 6 hours or more at a temperature of 1400° C. or less. It should be understood that 1400° C. is a temperature less than or equal to the melting point of $CaF_2$. As a result, a compacted mass of polycrystalline $CaF_2$ is obtained whose relative density is 94.0% or greater, and the mean particle diameter of whose crystalline particles is 200 μm or greater.

Next, the compacted mass of polycrystalline $CaF_2$ is processed into the desired shape. And polishing is performed by machine processing, so that the surface roughness Ra of the junction surfaces when making the focusing ring 1 (shown by the reference symbol 21 in FIGS. 1A-B) becomes 1.0 μm or less. As a result, the partial member 2 is manufactured.

The junction surfaces 21 of one partial member 2 that has been manufactured as described above and the junction surfaces 21 of other such partial members 2 are contacted together, heat is applied thereto at a predetermined temperature in a vacuum or in an atmosphere of inert gas, and the partial members 2 are pressurized so as to apply a load of 1 MPa or greater at the contact surfaces of the junction surfaces 21. As a result, the focusing ring 1 shown in FIG. 1A is manufactured. By joining together the partial members 2 of this embodiment that are manufactured using polycrystalline $CaF_2$ in this manner, it is possible to provide a focusing ring 1 having excellent corrosion resistance and workability, and moreover it is simple and easy to increase the size of this focusing ring 1.

Figure 1C:
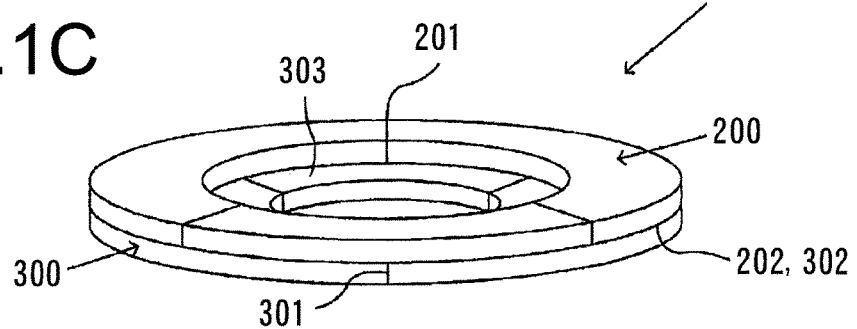
Figure 1D:
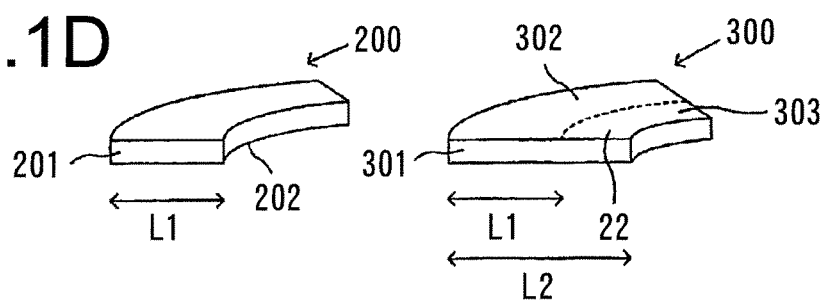

FIG. 1C shows a variant embodiment of the focusing ring 1. The focusing ring 100 shown in FIG. 1C is a combined assembly that results from three partial members 200 and three partial members 300, i.e. a total of six partial members, being joined together. The partial members 200 and the partial members 300 have the shapes shown in FIG. 1D. The widths L1 of the partial members 200 in the radial direction of the focusing ring 100 and the widths L2 of the partial members 300 are set to different lengths, with the length of the width L2 being greater than that of the width L1. The partial members 200 are joined together at junction surfaces 201, and the partial members 300 are joined together at junction surfaces 301. Moreover, the partial members 200 and the partial members 300 are joined together at junction surfaces 202 and junction surfaces 302. It should be understood that, by setting the width L2 of the partial members 300 to be greater than the width L1 of the partial members 200, it is possible to provide surfaces 303, upon the same plane as the junction surfaces 302 of the partial members 300, to which the partial members 200 are not joined. These surfaces 303 to which the partial members 200 are not joined function as the step portion of the focusing ring 100.

During the manufacture of this focusing ring 100, in the assembly of the six partial members into the shape of the focusing ring, it would be acceptable to arrange to perform pressure bonding together of all of the six partial members simultaneously; or, alternatively, it would also be acceptable to form two annular members by pressure bonding together the three partial members 200 and doing the same for the three partial members 300, and subsequently to perform pressure bonding to combine together these two resulting annular members vertically. It should be understood that the number of partial members 200 and 300 that make up the focusing ring 100 is not to be considered as being limited to a total of six as described above; it would also be possible to form the focusing ring 100 from any optimum number of partial members 200 and 300, according to the size of the focusing ring 100 and so on.

Figure 2:
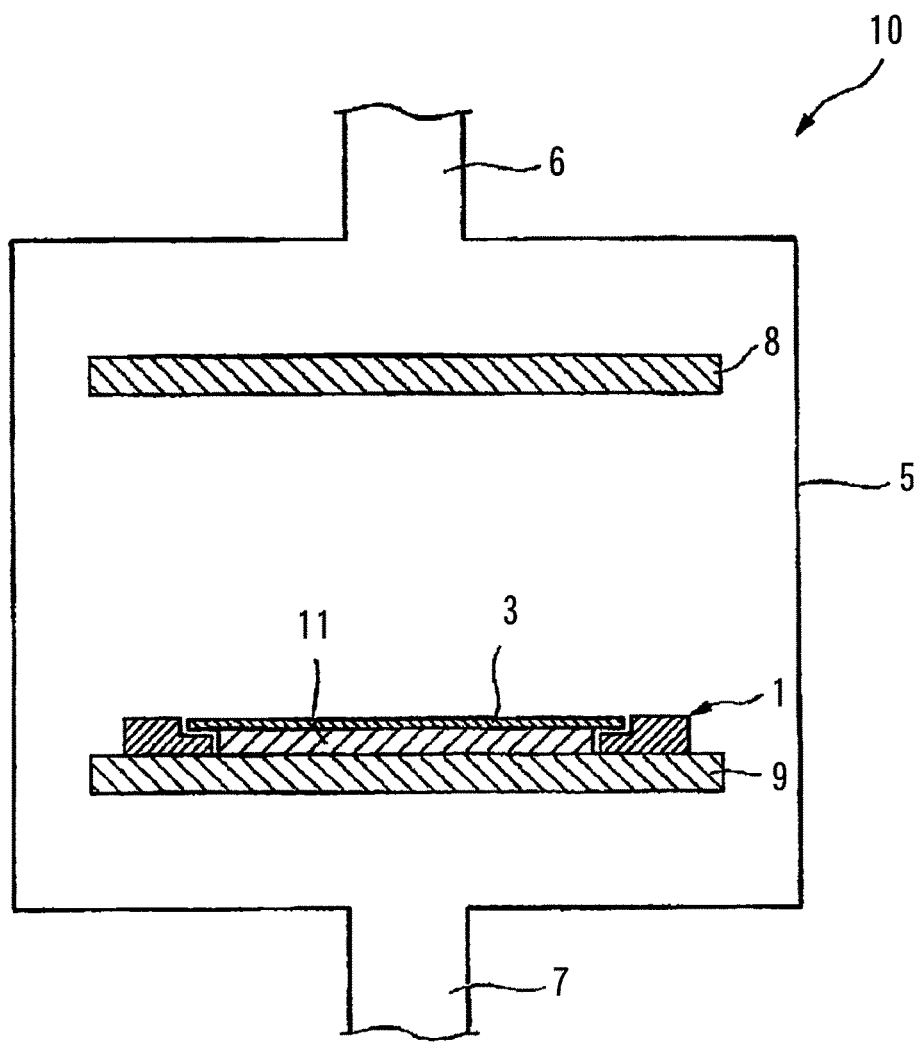
FIG. 2 is a schematic figure of a plasma treatment device incorporating such a focusing ring.

FIG. 2 is a schematic drawing of a plasma treatment device that is equipped with a focusing ring 1 such as that described above. In this plasma treatment device 10 of FIG. 2, an upper electrode 8 and a lower electrode 9 are provided within a chamber 5 that has a gas supply orifice 6 and a gas venting outlet 7. An electrostatic chuck 11 and the focusing ring 1 are provided on the upper surface of the lower electrode 9, in order to support an object to be processed 3. The electrostatic chuck 11 is disposed so as to be surrounded by the focusing ring 1, and thus, by the object to be processed 3 being disposed above the electrostatic chuck 11, the periphery of the object to be processed 3 is surrounded by the focusing ring 1.

In order to perform plasma etching upon the object to be processed 3 using this plasma treatment device 10, first, in the state in which the chamber 5 has been exhausted to vacuum, etching gas is supplied from the gas supply orifice 6. At this time, a high frequency voltage is applied between the upper electrode 8 and the lower electrode 9. The high frequency electric field thus generated between the upper electrode 8 and the lower electrode 9 converts the etching gas into plasma, and thereby plasma is generated. Etching of the object to be processed 3 is performed by this plasma.

While plasma etching upon the object to be processed 3 is being performed in the above manner, the focusing ring 1 is also exposed to the plasma, just as is the object to be processed 3. Due to this, it is advantageous to use the polycrystalline $CaF_2$ according to this embodiment as an appropriate material for the focusing ring 1, since its corrosion resistance is excellent.

While the present invention will be explained in the following in more concrete terms with reference to concrete embodiments thereof, the present invention is not to be considered as being limited to the following concrete embodiments.

[Manufacture of the Test Specimens]

Raw $CaF_2$ powder material of median diameter 32.7 μm was prepared, and was transformed into raw material of median diameter 3 μm or less by being pulverized with a ball mill. Using this raw material, formation was performed using the casting method described above. In other words, a slurry made by mixing the $CaF_2$ raw material with water was put into a gypsum mold, and, after having been left to stand for at least 48 hours at room temperature, the resulting mass was taken out from the gypsum mold and was dried for 48 hours in a drying oven at 80° C., so that a compacted mass was manufactured.

Heat at 1250° C. was applied in a vacuum to the resulting compacted mass for six hours, so that it was sintered. After this sintering, the compacted mass was extracted, and a test specimen of size 3 mm×4 mm×5 mm was cut out therefrom by a cutting and grinding process. Subsequently both sides of this test specimen were ground to a mirror finish, so that the surface roughness Ra of its junction surfaces was 0.16 to 1.64 μm.

(Concrete Embodiments #1 Through #8, and Comparison Examples #1 Through #4)

The test specimens were put into a vacuum oven, load was applied in the state in which their junction surfaces were contacted together, and the pressure in the oven was brought to 10 MPa or lower. Thereafter, over six hours, the oven was heated up to a desired temperature, and pressure bonding of the test specimens was performed by holding them at the target temperature. This target temperature will be termed the "holding temperature". The test specimens were held at the holding temperature for six hours, and thereafter were cooled and were taken out from the oven. For various conditions of different holding temperature, pressurization force, and surface roughness Ra of the test specimens, it was checked whether or not the test specimens were properly pressure bonded.

The lower limit for the holding temperature was 500° C. If the holding temperature is greater than 800° C., then it becomes easier to perform pressure bonding of the test specimen. However, since the test specimens disintegrated when the holding temperature was greater than 1400° C., accordingly the holding temperature should be less than or equal to 1400° C.; but it is desirable for the holding temperature not to exceed 1250° C., since, if it exceeds 1250° C., then this exerts an influence upon the physical properties possessed by the raw material of the test specimens. Accordingly, when pressure bonding the test specimens, the holding temperature was set to between 800° C. and 1200° C.

The higher the pressurization force applied to the test specimens was, the better was the bonding of the test specimens. However, if the pressurization force becomes too high, along with the test specimens being easily broken, also the cost of the manufacturing device becomes high, so that a low pressurization force is more desirable. Accordingly, the pressurization force when pressure bonding the test specimens was set to be from 0.9 to 1.8 MPa.

The pressure bonding results for the concrete embodiments #1 through #8 and for the comparison examples #1 through #4, for which the surface roughnesses Ra, the holding temperatures, and the pressurization forces are different, are shown in FIG. 3. As shown in FIG. 3, the concrete embodiments #1 through #3 show the results of pressure bonding when the holding temperature was 1200° C. and the pressurization force was 1.8 MPa, and when the surfaces roughnesses Ra of the test specimens were different. And the concrete embodiments #4 through #6 show the results of pressure bonding when the holding temperature was 1200° C. and the pressurization force was 0.9 MPa, and when the surfaces roughnesses Ra of the test specimens were different. Moreover, the concrete embodiments #7 and #8 and the comparison example #1 show the results of pressure bonding when the holding temperature was 1000° C. and the pressurization force was 0.9 MPa, and when the surfaces roughnesses Ra of the test specimens were different. Finally, the comparison examples #2 through #4 show the results of pressure bonding when the holding temperature was 800° C. and the pressurization force was 0.9 MPa, and when the surfaces roughnesses Ra of the test specimens were different. In FIG. 3, "○" shows that the test specimen in question was pressure bonded satisfactorily, while "x" shows that the test specimen in question was not pressure bonded. In other words, it is seen that the test specimens of the concrete embodiments #1 through #8 were pressure bonded, while those of the comparison examples #1 through #4 were not pressure bonded.

In the concrete embodiments #4 and #7 and in the comparison example #2, it is seen that the surface roughnesses of the test specimens were 0.16 μm, 0.19 μm, and 0.17 μm respectively, so that it can be deemed that the surface roughnesses Ra were substantially equal. In this case, as shown in FIG. 3, in the case of the test specimen of the comparison example #2, in other words in the case when the holding temperature was 800° C., the test specimen was not pressure bonded. As a result, it is understood that it is desirable for the holding temperature to be 1000° C. or higher.

Moreover, in the concrete embodiments #7 and #8 and in the comparison example #1, when pressure bonding processing was performed with a holding temperature of 1000° C. and a pressurization force of 0.9 MPa, the test specimen of the comparison example #1 for which the surface roughness Ra was 1.67 μm was not pressure bonded. As a result, it is understood that it is desirable for the surface roughness to be low in order to perform pressure bonding processing. Moreover, in the concrete embodiments #1 through #8 for which the holding temperature was 1000° C., the test specimen for which the surface roughness Ra was lowest was the test specimen of concrete embodiment #6, and in this case the surface roughness Ra was 1.0 μm. Accordingly, in order for the test specimen to be pressure bonded, it is desirable for the surface roughness of the junction surfaces to be 1.0 μm or less.

On the basis of the results of the concrete embodiments #1 through #8 and the comparison examples #1 through #4 described above, it is seen to be desirable, when manufacturing the focusing ring 1 by pressure bonding the partial members 2 together, for the holding temperature to be greater than or equal to 1000° C., and for the surface roughness Ra of the junction surfaces 21 of the partial members 2 to be 1.0 μm or less.

On the basis of the results shown in FIG. 3, it is seen to be possible to manufacture a focusing ring 1 in which the junction surfaces 21 of the partial members 2 are joined together by pressure bonding using the plurality of partial members 2 that are made from polycrystalline $CaF_2$. As a result, it is possible to manufacture the focusing ring 1 without using any material that could be a source of contamination for the object to be processed 3, such as an adhesive or a band member or the like.

A plasma resistant member, of which a focusing ring for a plasma treatment device is a representative, has a tendency to increase in size along with increase of the diameter of silicon wafers. When manufacturing a large sized focusing ring from $CaF_2$, there have been problems of the material yield factor and the manufacturing yield factor being low and of increase in cost, since it is necessary to eliminate the central portion of the material that has been sintered in order to form it into an annulus. By contrast, by joining together the plurality of partial members 2, it is possible to prevent decrease of the material yield factor and of the manufacturing yield factor, and to suppress increase of the cost, and it also becomes possible to increase the size of the focusing ring 1.

Furthermore, the partial members 2 are made from polycrystalline $CaF_2$ of which the relative density is 94.0% or higher, and the mean particle diameter of whose crystalline particles is 200 μm or greater. Accordingly, by joining together these partial members 2, it is possible to provide a focusing ring 1 whose workability and corrosion resistance are excellent.

The present invention is not to be considered as being limited by the embodiments described above; provided that the essential characteristics of the present invention are preserved, other embodiments that are considered to be embraced within the range of the technical concept of the present invention are also included within the scope of the present invention.

What is claimed is:

1. A polycrystalline $CaF_2$ member comprising:
   a combined assembly of a plurality of polycrystalline bodies made from $CaF_2$ that are pressure bonded together, each of the plurality of polycrystalline bodies comprising sintered minute crystals of $CaF_2$ particles, and a mean particle diameter of the minute crystals of the plurality of polycrystalline bodies being greater than or equal to 200 μm.

2. The polycrystalline $CaF_2$ member according to claim 1, wherein:
   a relative density of polycrystalline $CaF_2$ of the polycrystalline bodies is greater than or equal to 94.0%.

3. A member for a plasma treatment device, comprising the polycrystalline $CaF_2$ member according to claim 1.

4. A member for a plasma treatment device, comprising the polycrystalline $CaF_2$ member according to claim 2.

5. The member for a plasma treatment device according to claim 3, wherein:
   the member for a plasma treatment device is a focusing ring.

6. The member for a plasma treatment device according to claim 4, wherein:
   the member for a plasma treatment device is a focusing ring.

7. A plasma treatment device, comprising the member for a plasma treatment device according to claim 3.

8. A plasma treatment device, comprising the member for a plasma treatment device according to claim 4.

* * * * *